Jan. 27, 1970 R. W. CONRAD ET AL 3,492,175
METHOD OF DOPING SEMICONDUCTOR MATERIAL
Filed Dec. 17, 1965
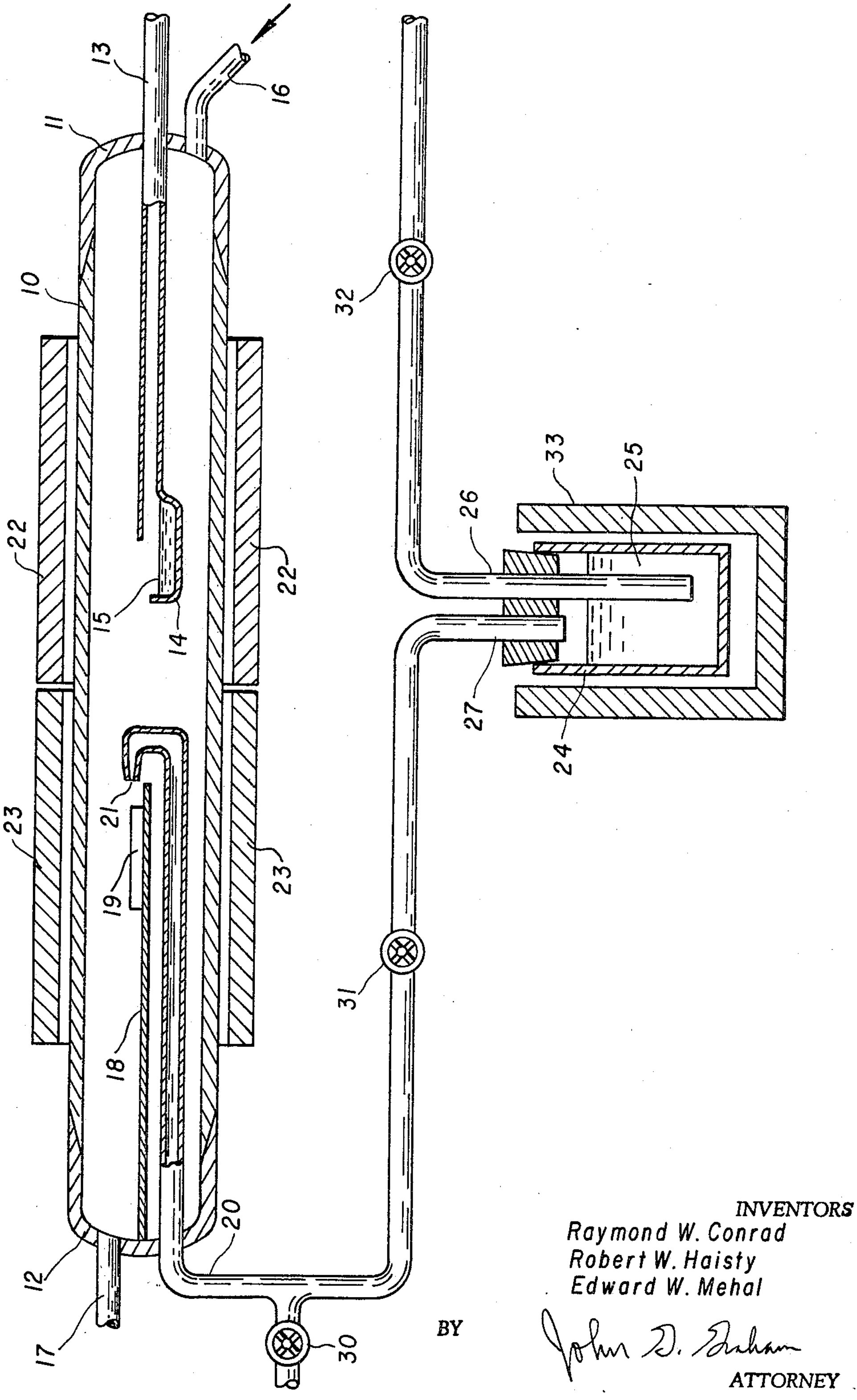
INVENTORS
Raymond W. Conrad
Robert W. Haisty
Edward W. Mehal
BY John D. Graham
ATTORNEY

3,492,175
METHOD OF DOPING SEMICONDUCTOR MATERIAL

Raymond W. Conrad, McKinney, Tex., Robert W. Haisty, Fellbach, Stuttgart, Germany, and Edward W. Mehal, Dallas, Tex., assignors to Texas Instruments Incorporated, Dallas, Tex., a corporation of Delaware Filed Dec. 17, 1965, Ser. No. 514,491
Int. Cl. H01l 7/36
U.S. Cl. 148—175 4 Claims

ABSTRACT OF THE DISCLOSURE

Gallium arsenide containing a dopant impurity element is deposited from the vapor phase epitaxially on a heated gallium arsenide substrate. A metal-organic compound of the dopant entrained in a carrier gas is reacted with gallium arsenide vapor formed by passing arsenic trichloride in proximity to heated gallium. The flow rate of the carrier gas may be varied to produce a dopant gradient in the epitaxial deposit. By sequentially entraining metal-organic compounds of other dopant elements, rectifying junctions or transistor structures may be formed on the substrate.

This invention relates to a method of forming epitaxial deposits of doped semiconductor material. More particularly, it relates to a method of forming epitaxial semiconductor material containing acceptor doping impurities.

In the production of semi-conductor materials by vapor phase reaction to form epitaxial deposits of semiconductor material upon a substrate, it is often advantageous to incorporate controlled amounts of donor or acceptor impurities in the epitaxial layer during the formation thereof. Occasionally the impurity concentration will be constant throughout the epitaxial layer. Generally, however, other doping profiles such as exponential or linear graded profiles are preferred.

Donor impurities may be incorporated in epitaxial deposits of Group IV semiconductors such as germanium and silicon by introducing controlled amounts of volatile inorganic compounds of the Group V elements, usually hydrides such as arsine ($AsH_3$) or phosphine ($PH_3$) into the vapor deposition system during the growth process. Likewise, for Group III–V compound semiconductors, volatile Group VI compounds such as hydrogen sulfide ($H_2S$), hydrogen selenide ($H_2Se$) and hydrogen telluride ($H_2Te$) can be used to provide donor impurities in the vapor deposition system. The addition of acceptor impurities to a vapor deposition system, however, is much more difficult. Generally, elements which are used as acceptor impurities in Group IV and Group III–V compound semiconductor materials are those elements from Groups III and II of the Periodic Table, respectively. These elements characteristically have low volatility. The Group II elements generally do not form volatile hydrides. With the exception of boron, the Group III elements do not form hydrides suitable for use as a dopant source. Consequently, other methods of doping with Group III and Group II elements have been devised. For example, the feed material used for the epitaxial process is sometimes doped to provide an acceptor impurity source. However, doping levels cannot be consistently reproduced with this method and controlled variation of doping levels is very difficult.

In the prior art a separate reservoir of the dopant placed inside the epitaxial deposition system has been used to provide an appreciable vapor pressure of the desired impurity. However, control of the doping level using this method is dependent upon very precise control of temperatures of the dopant reservoir. Furthermore, it is difficult to stop and start the flow of dopant material sharply.

It is therefore an object of this invention to provide a method of making acceptor doped epitaxial deposits of semiconductor material. It is another object to provide a method of controlling the doping level of acceptor impurities in epitaxially formed semiconductor material and to provide a method for varying the concentration of acceptor impurities in epitaxial material as desired.

These and other objects and advantages of the invention will become more readily understood from the following detailed description when taken in conjunction with the appended claims and attached drawing, in which the sole figure is an elevational view in section of a vapor phase reactor system suitable for carrying out the invention.

In accordance with this invention, acceptor impurities are introduced into a vapor phase reactor in the form of volatile metal-organic compounds of doping impurity elements. These organo-metallic compounds are entrained in a carrier gas and admitted to the reactor in controlled amounts as desired. The organo-metallic compound decomposes in the reactor, releasing the acceptor impurity. The other decomposition products are entrained in the waste gases from the reactor and carried out of the reactor system.

Referring to the figure, an apparatus suitable for practicing the invention is shown. The apparatus comprises an elongated cylindrical reactor 10 fitted with end caps 11 and 12. An inlet tube 13 passes through end cap 11 which supports a feed material container 14 containing suitable feed material 15. End cap 11 is also fitted with a suitable inlet 16 for introducing flush gas into the system.

End cap 12 is fitted with an exhaust outlet 17 and also supports a substrate holder 18 upon which the substrate 19 is supported within the reactor 10. A dopant feed line 20 passing through end cap 12 introduces the dopant gas into the reactor 10 through a suitable orifice 21.

The reactor assembly is partially contained within a suitable furnace comprised of heating elements 22 and 23 which may be individually controlled to maintain the substrate 19 and the feed material 15 at different temperatures.

In the preferred embodiment of the invention, the organo-metallic vapor is introduced into the reactor 10 by way of a bubbler 24 in which the organo-metallic compound 25 is contained. The organo-metallic liquid 25 is transported from the bubbler 24 into the reactor 10 by bubbling a carrier gas through an inlet tube 26. The carrier gas flowing through tube 26 bubbles through the liquid 25 and carrys vapors thereof through tube 27 and into the impurity feed line 20. Alternatively, vapors of the dopant compound may be entrained in the carrier gas by passing the carrier over the surface of the liquid. The concentration of dopant vapor in the carrier gas is then controlled by the vapor pressure of the organo-metallic liquid.

Operation of the apparatus of the figure is described hereinafter with particular reference to acceptor doping of epitaxially formed gallium arsenide. However, it will be understood that the particular description is by way of reference and not by way of limitation. Those skilled in the art will recognize that the principles of the invention are equally applicable to acceptor doping of other Group III–V compounds and to the acceptor doping of epitaxially formed Group IV semiconductor materials as well.

In operating the apparatus shown and described above to produce acceptor-doped gallium arsenide in accordance with the principles of the invention, a suitable feed material 15 such as gallium or gallium arsenide is placed in the feed material receptacle 14. A suitable substrate 19, such as a crystalline wafer of gallium arsenide, is positioned on the substrate holder 18 within the reactor 10. A flush gas, for example hydrogen, is admitted to the reactor through flush inlet 16 to purge oxygen and water vapors from the reactor. Heating elements 22 and 23 are activated to raise the temperautre of the reactor 10 to a suitable operation temperature. For the epitaxial deposition of gallium arsenide the portion of the furnace within heating element 22 is raised to approximately 1000° C. The portion of the reactor containing the substrate 19 is maintained at a lower temperature, establishing a temperautre gradient decreasing with distance from the feed source material 15. The temperature of the substrate 19 is maintained at about 500–750° C.

A suitable volatile Group V halide such as arsenic trichloride ($AsCl_3$) is admitted to the reactor through feed line 13. The feed material container 14 is so constructed as to cause gas entering through feed line 13 to contact the feed material 15 as it flows out of the feed line and into the interior of the reactor 10. As the gas passes over the feed material 15, gallium chloride vapors formed by the reaction of $AsCl_3$ with the feed material 15 are swept out of the container 14 and into the reaction vessel cavity.

A carrier gas, for example hydrogen, is admitted to the reactor through flush valve 16 to aid in sweeping the reactants through the reactor. As the reactants pass through the decreasing temperature gradient in the region of the substrate 19, gallium arsenide is formed by vapor phase chemical transformation and epitaxially deposited on the surface of the substrate 19. Reaction by-products are removed from the system through exhaust 17.

In accordance with the invention, volatile organometallic compounds of the desired acceptor dopant material are contained in the bubbler 24. Suitable acceptor dopant materials for the Group III–V compounds are organo-metallic compounds of the Group II elements, particularly zinc, cadmium and mercury. Other elements frequently used as acceptor dopants are magnesium, copper, gold, manganese, iron, cobalt, and nickel. Suitable organo-metallic compounds of these elements, along with their respective boiling points are set forth in Table I.

TABLE I.—ORGANO-METALLIC COMPOUNDS OF ACCEPTOR IMPURITIES IN GROUP III–V SEMICONDUCTIORS

| Name | Formula | B.P. (° C.) |
|---|---|---|
| Dicyclopentadienyl magnesium. | $(C_5H_5)Mg$ | Vapor pressure 10 Torr at 200° C. |
| Dimethyl zinc | $(CH_3)_2Zn$ | 46. |
| Diethyl zinc | $(C_2H_5)_2Zn$ | 118. |
| Di-n-propyl zinc | $(C_3H_7)_2Zn$ | 160. |
| Di-n-butyl zinc | $(C_4H_9)_2Zn$ | 195. |
| Di-i-amyl zinc | $(C_5H_{11})_2Zn$ | 220. |
| Dimethyl cadium | $(CH_3)_2Cd$ | 105. |
| Diethyl cadium | $(C_2H_5)_2Cd$ | Vapor pressure 19.5 Torr at 64° C. |
| Di-n-butyl cadium | $(C_4H_9)_2Cd$ | Vapor pressure 12.5 Torr at 103° C. |
| Dimethyl mercury | $(CH_3)_2Hg$ | 92. |
| Divinyl mercury | $(C_2H_3)_2Hg$ | 156. |
| Diethyl mercury | $(C_2H_5)_2Hg$ | Vapor pressure 16 Torr at 57° C. |
| Bis(chlorocopper) acetylene | $C_2H_2(CuCl)_2$ | Vapor pressure 434 Torr at 25° C. |
| Tris (chlorocopper) acetylene | $C_2H_2(CuCl)_3$ | Vapor pressure 287 Torr at 25° C. |
| Dipropyl chloroaurane | $(C_3H_7)_2AuCl$ | 107 (decomposition). |
| Hydro pentacarbonyl manganese. | $HMn(CO)_5$ | 111. |
| Dicyclopentadienyl manganese-tetra-ammine. | $(C_5H_5)_2Mn \cdot 4NH_3$ | Vapor pressure 10 Torr at 25° C. |
| Dicarbonyl dinitrosyl iron | $(CO)_2Fe(NO)_2$ | 118. |
| Pentacarbonyl iron | $Fe(CO)_5$ | 103. |
| Tricarbonyl nitrosylcobalt | $(CO)_3Co(NO)$ | 78.6. |
| Cyclopentadienyl dicarbonyl cobalt. | $Co(C_5H_5)(CO)_2$ | Vapor pressure 22 Torr at 75° C. |
| Dicyclopentadienyl dicarbonyl cobalt. | $Co(C_5H_5)_2(CO)_2$ | 139. |
| Tetracarbonyl nickel | $Ni(CO)_4$ | 43. |
| Cyclopentadienyl nitrosylnickel. | $C_5H_5NiNO$ | Vapor pressure 27 Torr at 49° C. |

In a specific embodiment of the invention, the organometallic compound suitable for acceptor doping of gallium arsenide may be diethyl zinc. The liquid diethyl zinc is placed in bubbler 24 and a suitable carrier gas such as hydrogen bubbled therethrough. The carrier gas is admitted to the bubbler through tube 26 and bubbles through the liquid 25. Carrier gas saturated with diethyl zinc vapor escapes the bubbler 24 through tube 27. The liquid-saturated vapor is then mixed with a suitable dilution gas, which may also be hydrogen, admitted through valve 30; and the diluted mixture is admitted through dopant feed line 20 into the reactor. The organo-metallic saturated vapor is then introduced into the reaction stream near the substrate 19 through an opening 21 in the end of tube 20.The organo-metallic compound decomposes at the temperature of the reaction furnace, thus leaving free zinc to combine with the gallium arsenide being formed by the vapor phase chemical transformation in reactor 10. The zinc is included in the epitaxial deposit, thereby forming acceptor doped gallium arsenide. The other decomposition products are swept out of the reactor through exhaust tube 17 along with spent gases from the deposition process.

The concentration of acceptor impurity in the epitaxial deposit is directly related to the amount of organo-metallic compound admitted to the reactor. The amount of organo-metallic compound passing through orifice 21 is dependent on such factors as the flow rate of carrier gas passing through tube 26, the vapor pressure of the liquid organo-metallic compound, the temperature of the organo-metallic compound, and the amount of dilution. Dilution may be suitably controlled by dilution valve 30 which controllably admits dilution gas to the dopant tube 20. The flow rate of carrier gas is controlled by valves 31 and 32. A suitable temperature control device 33, such as a heater or cooler, surrounding the bubbler 24 is used to control the temperature of the organo-metallic compound. Accordingly, a wide range of metal-organic compounds, including some which are solid at room temperature, can be used in the apparatus shown by suitably controlling the temperature of the bubbler 24.

The amount of metal-organic dopant compound admitted to the epitaxial reactor can be varied as desired, thus varying the concentration of acceptor impurity in the epitaxial deposit as the deposit is formed. The amount of dopant compound can be varied by varying the flow rate of the carrier gas or by varying the temperature of the bubbler, thus varying the vapor pressure of the organo-metallic liquid in the bubbler 24. Furthermore, the flow of doping compound can be stopped or started with ease without affecting other conditions in the reactor vessel 10. The concentration of the acceptor impurity in the epitaxial deposit thus may be varied as desired to form epitaxial deposits with graded impurity concentrations or deposits with alternate layers of doped and undoped epitaxial material.

Since the acceptor doping method of this invention may be stopped and started as desired, P-N-P and N-P-N structures may be epitaxially formed in a single operation by alternately introducing acceptor impurities as described above and donor impurities such as $H_2S$ by conventional techniques.

Although the invention has been described with respect to including acceptor impurities in epitaxially formed Group II–V semiconductors, the principles thereof are equally applicable to forming acceptor-doped Group IV semiconductor epitaxial deposits. Suitable organo-metallic compounds which may be used to provide acceptor impurities in Group IV semiconductors, along with their respective boiling points, are set forth in Table II. Acceptor-doped Group IV semiconductor epitaxial deposits may be formed in accordance with the invention by introducing organo-metallic compounds of the desired acceptor impurity into a suitable epitaxial reactor as described above with reference to gallium arsenide.

TABLE II.—ORGANO-METALLIC COMPOUNDS OF ACCEPTOR IMPURITIES IN GROUP IV SEMICONDUCTORS

| Name | Formula | B.P. (° C.) |
|---|---|---|
| Borine carbonyl | $BH_3CO$ | −64. |
| Dimethyl chloroborine | $(CH_3)_2BCl$ | 4.9. |
| Methyl dichloroborine | $CH_3BCl_2$ | 11.1. |
| Methyl dibromoborine | $CH_3B\ Br_2$ | 60.0. |
| Ethoxy dichloroborine | $C_2H_5OBCl_2$ | 78. |
| Butyl dichloroborine | $C_4H_9BCl_2$ | 106–8. |
| Dipropyl chloroborine | $(C_3H_7)_2BCl$ | 127. |
| o-Tolyl dichloroborine | $CH_3C_6H_4BCl_2$ | 193. |
| Tributoxy borine | $(C_4H_9O)_3B$ | 230. |
| Dimethyl chloroalumine | $(CH_3)_2AlCl$ | 119.4. |
| Trimethyl alumine | $(CH_3)_3Al$ | 126. |
| Dimethyl alumine | $(CH_3)_2AlH$ | 154. |
| Dimethyl chloroalumine-dimethyl ether. | $(CH_3)_2AlCl{\cdot}(CH_3)_2O$ | 224. |
| Tripropyl alumine | $(C_3H_7)_3Al$ | 250. |
| Triethoxy alumine | $(C_2H_5O)_3Al$ | 320. |
| Trimethyl galline | $(CH_3)_3Ga$ | 55.7 |
| Trimethyl galline-etherate | $(CH_3)_3Ga{\cdot}O(C_2H_5)_2$ | 98.3. |
| Triethyl galline | $(C_2H_5)_3Ga$ | 143. |
| Dimethyl methoxygalline-dimer. | $[(CH_3)_2CH_3O\ Ga]_2$ | 170. |
| Trimethyl indine | $(CH_3)_3In$ | 135.8. |
| Triethyl indine | $(C_2H_5)_3In$ | 144. |
| Tripropyl indine | $(C_3H_7)_3In$ | 178. |
| Triethyl thallane | $(C_2H_5)_3Tl$ | 192 (extrapolated) decomposes 100. |
| Bis(chlorocopper)-acetylene | $C_2H_2(CuCl)_2$ | Vapor pressure 434 Torr at 25° C. |
| Tris (chlorocopper) acetylene. | $C_2H_2(CuCl)_3$ | Vapor pressure 287 Torr at 25° C. |
| Dimethyl mercury | $(CH_3)_2Hg$ | 92. |
| Divinyl mercury | $(C_2H_3)_2Hg$ | 156. |
| Diethyl mercury | $(C_2H_5)_2Hg$ | Vapor pressure 16 Torr at 57° C. |

Epitaxial deposits may be concurrently doped with acceptors and donor impurities in accordance with the invention by using a metal-organic compound containing both acceptor and donor impurities as set forth in Table III.

TABLE III.—ORGANO-METALLIC COMPOUNDS OF ACCEPTOR AND DONOR IMPURITIES IN GROUP IV SEMICONDUCTORS

| Name | Formula | B.P. (° C.) |
|---|---|---|
| Borine-methyl phosphine | $CH_3PH_2{\cdot}BH_3$ | 150 |
| Borine-dimethyl arsine | $(CH_3)_2AsH{\cdot}BH_3$ | 85.5 |

Although particular reference has been made to metal-organic compounds of acceptor doping impurities, it will be appreciated that the principles of the invention are applicable to the introduction of donor impurities into epitaxially formed semiconductor materials when such donor impurities cannot be found in an otherwise suitable volatile form. It will be understood that the examples given in Tables I, II and III are merely illustrative of the various organo-metallic compounds which may be used in practicing the invention.

It is to be understood that the above-described methods and embodiments are merely illustrative of the application of the principles of the invention. Numerous other compounds and arrangements may be devised by those skilled in the art without departing from the spirit and scope of the invention as defined by the appended claims.

What is claimed is:

1. The method of forming epitaxial deposits of doped semiconductor material comprising the steps of:

placing a gallium arsenide substrate in a reactor assembly; placing a quantity of elemental gallium in said reactor assembly; heating said substrate to a temperature of about 500° to 750° C.; heating said elemental gallium to a temperature of about 1000° C.; passing arsenic trichloride in proximity to said elemental gallium to form gallium arsenide vapor; entraining a first metal-organic compound of a first impurity element in a carrier gas; and introducing a predetermined amount of said carrier gas into said reactor assembly to react with said gallium arsenide vapor, thereby forming epitaxially deposited gallium arsenide doped with said impurity element on said substrate.

2. The method of claim 1 including the additional step of varying the flow rate of said carrier gas to achieve a dopant gradient in the epitaxially deposited gallium arsenide.

3. The method of claim 1 including the further steps of entraining in a carrier gas a second metal-organic compound of a second impurity element of a type which produces opposite conductivity doping in gallium arsenide from that produced by said first impurity element, and passing said carrier gas in which said second metal-organic compound is entrained through said reactor assembly subsequent to the step of passing said carrier gas in which said first metal-organic compound is entrained through said reactor assembly, thereby epitaxially forming a rectifying junction on said substrate.

4. The method of claim 3 including the further steps of entraining in a carrier gas a third metal-organic compound of a third impurity element of a type which produces opposite conductivity doping in gallium arsenide from that produced by said second impurity element, and passing said carrier gas in which said third metal-organic compound is entrained through said reactor assembly subsequent to the step of passing said carrier gas in which said second metal-organic compound is entrained through said reactor assembly, thereby epitaxially forming a transistor structure on said substrate.

References Cited

UNITED STATES PATENTS

| | | | |
|---|---|---|---|
| 2,778,802 | 1/1957 | Willardson et al. | 252—62.3 |
| 3,173,814 | 3/1965 | Law | 148—175 |
| 3,224,913 | 12/1965 | Ruehrwein | 148—175 |
| 3,226,270 | 12/1965 | Miederer et al. | 148—174 |
| 3,310,502 | 3/1967 | Komatsubara et al. | 52—62.3 XR |
| 3,312,570 | 4/1967 | Ruehrwein | 148—175 |
| 3,312,571 | 4/1967 | Ruehrwein | 148—175 |
| 3,342,551 | 9/1967 | Dotzer | 252—62.3 XR |

OTHER REFERENCES

Coates: Organo-Metallic Compounds, John Wiley & Sons, Inc., New York, Oct. 26, 1956, pp. 286–300.

L. DEWAYNE RUTLEDGE, Primary Examiner

E. L. WEISE, Assistant Examiner